US010636491B2

(12) United States Patent
Shin et al.

(10) Patent No.: US 10,636,491 B2
(45) Date of Patent: Apr. 28, 2020

(54) FLASH MEMORY DEVICE AND METHOD OF PROGRAMMING THE SAME

(71) Applicant: SAMSUNG ELECTRONICS CO., LTD., Suwon-si (KR)

(72) Inventors: Hoyoung Shin, Gunpo-si (KR); Myeonghee Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/003,848

(22) Filed: Jun. 8, 2018

(65) Prior Publication Data

US 2019/0115077 A1 Apr. 18, 2019

(30) Foreign Application Priority Data

Oct. 18, 2017 (KR) .................. 10-2017-0135441

(51) Int. Cl.
| | |
|---|---|
| *G11C 16/04* | (2006.01) |
| *G11C 16/10* | (2006.01) |
| *G11C 16/08* | (2006.01) |
| *G11C 16/24* | (2006.01) |
| *H01L 29/788* | (2006.01) |
| *G11C 11/4074* | (2006.01) |
| *G11C 7/04* | (2006.01) |
| *G11C 16/30* | (2006.01) |
| *G11C 16/34* | (2006.01) |
| *H01L 29/423* | (2006.01) |

(52) U.S. Cl.
CPC ............... *G11C 16/10* (2013.01); *G11C 7/04* (2013.01); *G11C 11/4074* (2013.01); *G11C 16/0425* (2013.01); *G11C 16/08* (2013.01); *G11C 16/24* (2013.01); *G11C 16/30* (2013.01); *G11C 16/3418* (2013.01); *H01L 29/7884* (2013.01); *G11C 16/0483* (2013.01); *G11C 2216/04* (2013.01); *H01L 29/42328* (2013.01)

(58) Field of Classification Search
CPC ..... G11C 16/10; G11C 16/0483; G11C 16/24; G11C 11/4074; G11C 7/04; G11C 16/08; H01L 29/7884
USPC ....................................................... 365/185.18
See application file for complete search history.

(56) References Cited

U.S. PATENT DOCUMENTS

| | | | |
|---|---|---|---|
| 6,205,074 B1 | 3/2001 | Van Buskirk et al. | |
| 6,870,766 B2 | 3/2005 | Cho et al. | |
| 7,269,092 B1 * | 9/2007 | Miwa ..................... | G11C 5/147 365/189.09 |
| 7,898,869 B2 | 3/2011 | Park | |
| 7,957,214 B2 | 6/2011 | Tanzawa et al. | |
| 8,031,511 B2 | 10/2011 | Osada et al. | |

(Continued)

*Primary Examiner* — Huan Hoang
(74) *Attorney, Agent, or Firm* — Sughrue Mion, PLLC

(57) ABSTRACT

A flash memory device includes a first memory cell, a second memory cell, a row decoder, and a bias generator. The first memory cell is a selected memory cell, and the second memory cell is an unselected memory cell connected with a bit line that is connected to the first memory cell. The row decoder controls a word line voltage to be applied to the first memory cell and controls an unselected source line voltage to be applied to the second memory cell. The bias generator generates the word line voltage based on a threshold voltage of a word line transistor changing with an ambient temperature and generates the unselected source line voltage based on a voltage level of the selected bit line.

18 Claims, 10 Drawing Sheets

(56) References Cited

U.S. PATENT DOCUMENTS

| | | |
|---|---|---|
| 8,081,508 B2 | 12/2011 | Kim et al. |
| 8,902,669 B2 | 12/2014 | Yang et al. |
| 9,202,579 B2 | 12/2015 | Hsiung et al. |
| 9,564,229 B2 | 2/2017 | Choi et al. |
| 9,805,807 B2 | 10/2017 | Lee et al. |
| 2003/0189856 A1 | 10/2003 | Cho et al. |
| 2009/0034330 A1 | 2/2009 | Park |
| 2010/0110793 A1 | 5/2010 | Kim et al. |
| 2010/0270994 A1 | 10/2010 | Tanzawa et al. |
| 2010/0329026 A1 | 12/2010 | Nakamura et al. |
| 2011/0128780 A1 | 6/2011 | Osada et al. |
| 2014/0126292 A1 | 5/2014 | Yang et al. |
| 2014/0269070 A1 | 9/2014 | Hsiung et al. |
| 2016/0078934 A1* | 3/2016 | Sekar ............... G11C 13/0069 365/148 |
| 2016/0260489 A1 | 9/2016 | Lee et al. |
| 2016/0343443 A1 | 11/2016 | Choi et al. |
| 2017/0278578 A1* | 9/2017 | Nagai ................ G11C 16/10 |

* cited by examiner

FLASH MEMORY DEVICE AND METHOD OF PROGRAMMING THE SAME

CROSS-REFERENCE TO RELATED APPLICATION

This application claims priority from Korean Patent Application No. 10-2017-0135441, filed Oct. 18, 2017, in the Korean Intellectual Property Office, the disclosures of which are incorporated by reference herein in their entireties.

BACKGROUND

1. Field

Devices and methods consistent with exemplary embodiments relate to a semiconductor memory device, and more particularly, relate to a flash memory device and a method of programming the same.

2. Description of the Related Art

A semiconductor memory refers to a memory device that is implemented using semiconductor such as silicon (Si), germanium (Ge), gallium arsenide (GaAs), indium phospide (InP), or the like. The semiconductor memory device is classified as a volatile memory device, such as a dynamic random access memory (DRAM), a static RAM (SRAM), or the like, or a nonvolatile memory device, such as an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

A nonvolatile memory may retain data stored therein even at power-off. In particular, a flash memory has advantages such as high program speed, low power consumption, storing of a large amount of data, and the like. Among the nonvolatile memory devices, the flash memory device that uses a floating gate way to store bit information through injection of charges into a floating gate formed of polysilicon is being variously used to implement a storage medium. Characteristics of memory cells included in the flash memory device may vary depending on an ambient temperature. The change in characteristics of the memory cells has an influence on injection of charges into a floating gate, thus having an influence on a program characteristic of the flash memory device. Accordingly, there is a need to prevent a program characteristic of the flash memory device from deteriorating depending on a temperature.

SUMMARY

One or more exemplary embodiments provide a flash memory device that prevents deterioration of a program characteristic due to a temperature change in a program operation and minimizes a leakage current of an unselected memory cell and a method of programming the same.

According to an exemplary embodiment, a flash memory device includes a first memory cell, a second memory cell, a row decoder, and a bias generator. The first memory cell includes a first cell transistor. A first terminal of a first transistor is connected to a selected bit line through a first word line transistor, and a second terminal thereof is connected to a selected source line. The second memory cell includes a second cell transistor. A first terminal of a second transistor is connected to the selected bit line through a second word line transistor, and a second terminal thereof is connected to an unselected source line.

The row decoder controls a word line voltage to be applied to a first word line connected to a control terminal of the first word line transistor. The row decoder controls a selected source line voltage to be applied to the selected source line and an unselected source line voltage to be applied to the unselected source line. The bias generator generates the word line voltage based on a threshold voltage of the first word line transistor varying with an ambient temperature. The bias generator generates the unselected source line voltage based on a voltage level of the selected bit line.

According to an exemplary embodiment, a program method of a flash memory device programs a selected memory cell. The method includes detecting an ambient temperature, generating a word line voltage based on the detected ambient temperature, generating an unselected source line voltage based on the word line voltage and a voltage level of the selected bit line, applying the word line voltage to the selected memory cell, and applying the unselected source line voltage to the unselected memory cell.

BRIEF DESCRIPTION OF THE FIGURES

The above and other aspects will become apparent by describing in detail exemplary embodiments thereof with reference to the accompanying drawings.

DETAILED DESCRIPTION

Below, embodiments will be described clearly and in detail with reference to accompanying drawings to such an extent that an ordinary one in the art implements embodiments of the invention.

Figure 1:
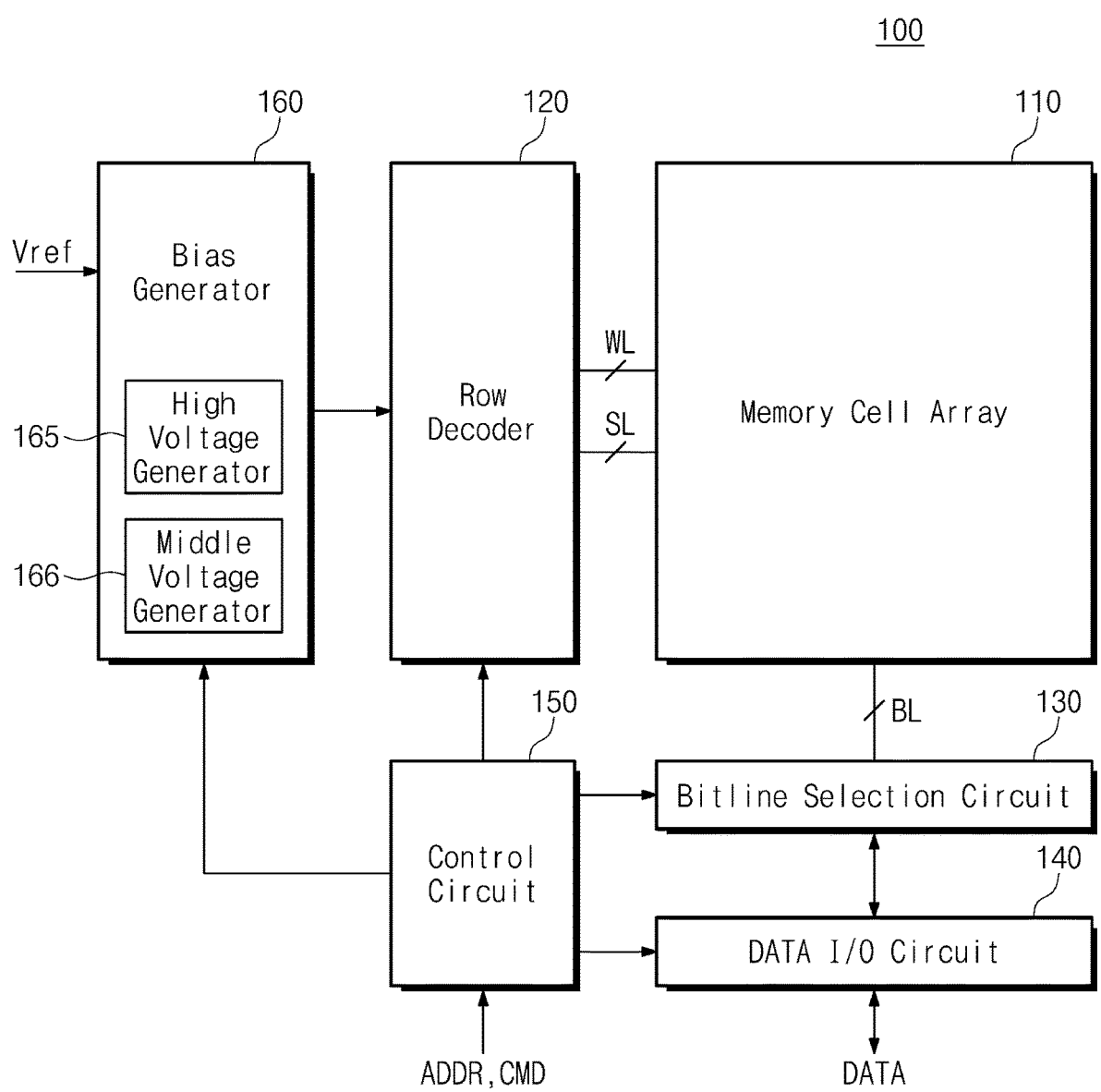
FIG. 1 is a block diagram of a flash memory device according to an exemplary embodiment.

FIG. 1 is a block diagram of a flash memory device according to an exemplary embodiment.

Referring to FIG. 1, a flash memory device 100 includes a memory cell array 110, a row decoder 120, a bit line selection circuit 130, a data input/output (I/O) circuit 140, a control circuit 150, and a bias generator 160.

The memory cell array 110 is connected to the row decoder 120 through word lines WL and source lines SL. The memory cell array 110 is connected to the bit line selection circuit 130 through bit lines BL. The memory cell array 110 includes a plurality of memory cells. For example, memory cells arranged in a row direction may share one word line or source line, and memory cells arranged in a column direction may share one bit line. Each of the memory cells may be configured to store one or more bits. The memory cell array 110 will be more fully described later.

The row decoder 120 is provided with a word line voltage and a source line voltage from the bias generator 160. The row decoder 120 may select a word line in a program operation or a read operation. The row decoder 120 may provide a word line voltage (or a program voltage) for the program operation to a selected word line. The row decoder 120 may provide a word line voltage (or a read voltage) for the read operation to a selected word line. The row decoder 120 may select a source line in the program operation. The row decoder 120 may provide a selected source line voltage for the program operation to a selected source line. The row decoder 120 may provide an unselected source line voltage to an unselected source line.

The row decoder 120 may be provided with a first voltage from a high voltage generator 165 included in the bias generator 160. Alternatively, the row decoder 120 may be provided with a second voltage having a voltage level lower than the first voltage from a middle voltage generator 166 included in the bias generator 160. For example, the row decoder 120 may provide the second voltage to a selected source line in the program operation. In the program operation, the row decoder 120 may provide the first voltage to a coupling gate of a memory cell to be described later and may provide the second voltage of an erase gate of the memory cell to be described later. In an erase operation, the row decoder 120 may provide the first voltage to the erase gate.

The bit line selection circuit 130 may select a bit line in the program operation or the read operation. In the program operation, a program current may flow to a bit line selected by the bit line selection circuit 130. In the program operation, a suppression voltage may be applied to a bit line that is not selected by the bit line selection circuit 130. In this case, memory cells connected to the unselected bit line may not be programmed. In the read operation, a read current may flow to a bit line selected by the bit line selection circuit 130.

The data input/output circuit 140 is connected with the bit line selection circuit 130. The data input/output circuit 140 may receive program data DATA from the outside of the flash memory device 100 in the program operation. For example, the data input/output circuit 140 may receive program data from a memory controller (not illustrated). The data input/output circuit 140 may provide read data to the outside of the flash memory device 100, for example, the memory controller (not illustrated) in the read operation.

The control circuit 150 controls overall operations of the flash memory device 100. The control circuit 150 may control the program operation, the read operation, and/or the erase operation of the flash memory device 100 by using a command CMD and an address ADDR provided from the memory controller (not illustrated). For example, the control circuit 150 may allow the row decoder 120 to select a word line and a source line based on the address ADDR. The control circuit 150 may allow the row decoder 120 to provide a word line voltage to a selected word line and a selected source line voltage to a selected source line. Also, the control circuit 150 may allow the bit line selection circuit 130 to select a bit line connected to a memory cell corresponding to a target of the program operation or the read operation. Also, the control circuit 150 may allow the data input/output circuit 140 to provide read data or to receive program data.

The control circuit 150 may control the bias generator 160. The control circuit 150 may control a voltage output by the bias generator 160 to the row decoder 120, depending on the program operation, the read operation, and the erase operation. For example, in the program operation, the control circuit 150 may allow the bias generator 160 to determine a level of a word line voltage to be provided to a selected word line, a level of a selected source line voltage to be provided to a selected source line, and a level of an unselected source line voltage to be provided to an unselected source line.

The bias generator 160 generates a voltage to be provided to the row decoder 120. The bias generator 160 may include the high voltage generator 165 and the middle voltage generator 166. However, the disclosure may not be limited thereto. For example, the bias generator 160 may further include voltage generators for generating voltages of various levels. For example, the bias generator 160 may further include a word line voltage generator and an unselected source line voltage generator used in the program operation. The word line voltage generator and the unselected source line voltage generator may generate voltages, the levels of which vary with an ambient temperature, which will be described with reference to FIG. 5.

The high voltage generator 165 may generate the first voltage under control of the control circuit 150 and may provide the first voltage to the row decoder 120. The high voltage generator 165 may receive a reference voltage Vref and may generate the first voltage higher in level than the reference voltage Vref. To this end, the bias generator 160 may further include a high voltage oscillator (not illustrated). The first voltage provided to the row decoder 120 may be applied to a coupling gate in the program operation.

The middle voltage generator 166 may generate the second voltage under control of the control circuit 150 and may provide the second voltage to the row decoder 120. The middle voltage generator 166 may receive the reference voltage Vref and may generate the second voltage higher in level than the reference voltage Vref and lower than the first voltage. Alternatively, the middle voltage generator 166 may divide a voltage generated in the high voltage generator 165 to generate the second voltage. The second voltage provided to the row decoder 120 may be applied to a source line and an erase gate line selected in the program operation.

Figure 2:
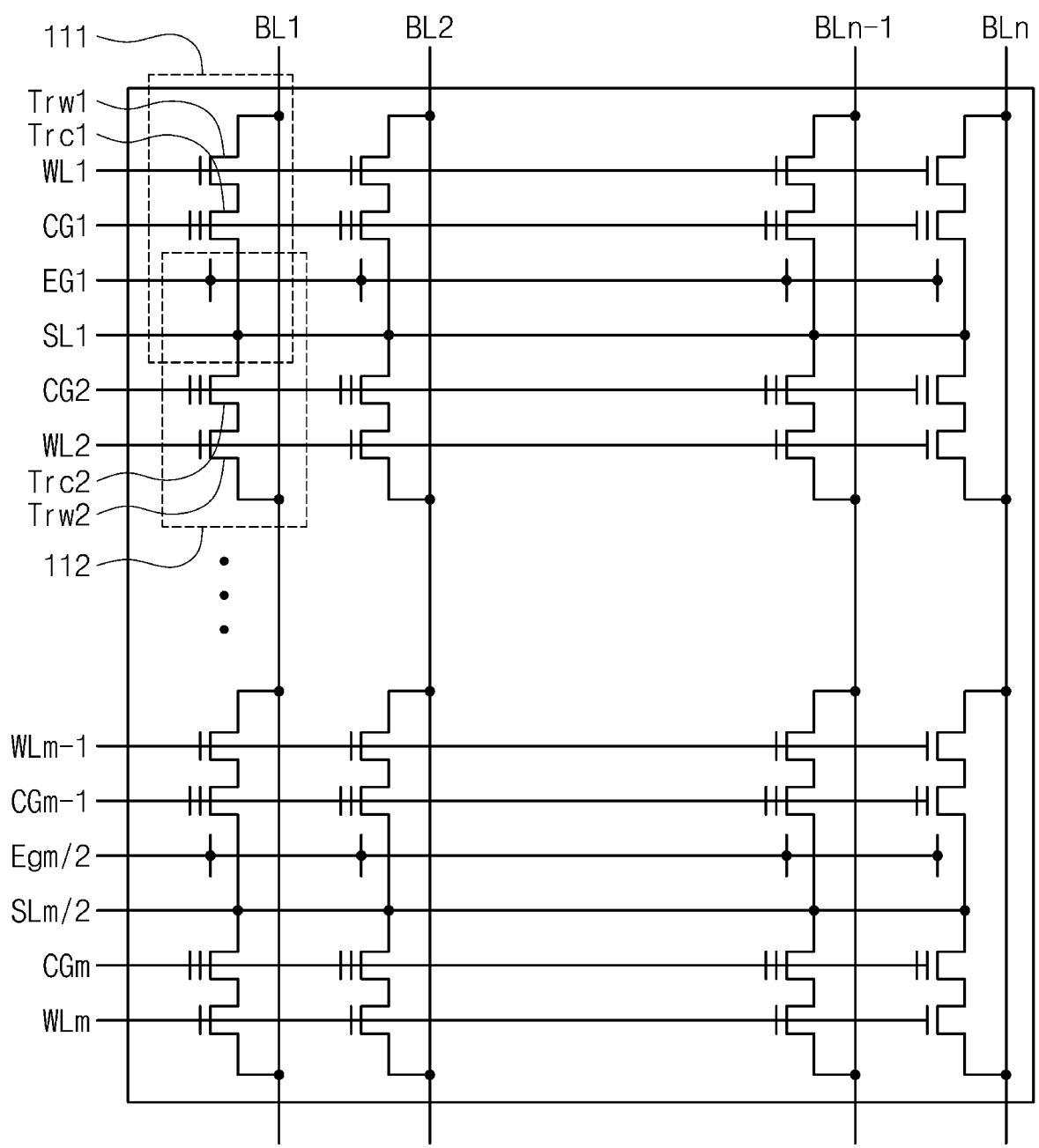
FIG. 2 is an exemplary circuit diagram of a memory cell array of FIG. 1.

FIG. 2 is an exemplary circuit diagram of a memory cell array of FIG. 1.

The memory cell array 110 of FIG. 2 is illustrated as including floating gate memory cells of a split gate type. However, the disclosure may not be limited thereto. Accordingly, the flash memory device 100 of FIG. 1 may include a memory cell array that is different from the memory cell array 110 of FIG. 2.

The memory cell array 110 may include a plurality of memory cells formed in a semiconductor substrate. It is assumed that the memory cell array 110 includes m-by-n memory cells. Bit lines BL1, BL2, . . . BLn−1, and BLn, word lines WL1, WL2, . . . WLm−1, and WLm, coupling gate lines CG1, CG2, . . . CGm−1, and CGm, source lines SL1 to SLm/2, and erase gate lines EG1 to EGm/2 connected with the plurality of memory cells may be formed in the semiconductor substrate. The plurality of memory cells may be connected to different word lines or to different bit lines. That is, the memory cell array 110 may be a memory cell array of a NOR flash type.

The memory cell array 110 may include a first memory cell 111 and a second memory cell 112. The first memory cell 111 includes a first word line transistor Trw1 and a first cell transistor Trc1. The first memory cell 111 is connected with a first word line WL1, a first coupling gate line CG1, a first erase gate line EG1, a first source line SL1, and a first bit line BL1.

The first word line transistor Trw1 includes a first terminal (or a first end) connected to the first bit line BL1, a second terminal (or a second end) connected to the first source line SL1 through the first cell transistor Trc1, and a control terminal connected to the first word line WL1. When a voltage provided to the first word line WL1 is greater than a threshold voltage of the first word line transistor Trw1, the first word line transistor Trw1 may form a channel area between the first terminal and the second terminal. The threshold voltage may be determined according to a characteristic of the first word line transistor Trw1. The voltage provided to the first word line WL1 may determine a bit line voltage applied to the first bit line BL1. A level of the bit line voltage applied to the first bit line BL1 may correspond to a difference between the voltage of the first word line WL1 and a threshold voltage of the first word line transistor Trw1.

The first cell transistor Trc1 includes a first terminal (or a first end) connected to the first bit line BL1 through the first word line transistor Trw1, a second terminal (or a second end) connected to the first source line SL1, and a control terminal connected to the first coupling gate line CG1. Also, the first cell transistor Trc1 may further include a floating gate into which charges are injected in a program operation. In the program operation, hot carriers may be injected into the floating gate of the first cell transistor Trc1 based on the voltage provided to the first coupling gate line CG1. Below, it is assumed that the first memory cell 111 is a memory cell selected for the program operation.

A potential difference between the voltage provided to the first source line SL1 and the voltage applied to the first bit line BL1 may generate hot carriers. To this end, a level of the voltage applied to the first source line SL1 may be higher than a level of the voltage applied to the first bit line BL1. A level of a voltage provided to the first erase gate line EG1 adjacent to the first source line SL1 may be the same as a level of the voltage applied to the first source line SL1. The voltage provided to the first coupling gate line CG1 generates a strong electric field such that hot carriers are injected into the floating gate. Accordingly, a high voltage may be applied to the first coupling gate line CG1.

A program characteristic of the first memory cell 111 may be improved as a large amount of hot carriers are generated or as a large amount of hot carriers are injected into the floating gate. In the case where a level of a voltage applied to the first source line SL1 increases, a potential difference between a voltage provided to the first source line SL1 and a voltage applied to the first bit line BL1 may increase. This may mean that the amount of hot carriers generated increases. Alternatively, in the case where a level of a voltage applied to the first coupling gate line CG1 increases, the amount of hot carriers injected into the floating gate may increase.

However, in the case of increasing a voltage to be applied to the first source line SL1 or the first coupling gate line CG1, the increased voltage may be applied to other memory cells connected to the first source line SL1 or the first coupling gate line CG1. That is, electrons may be injected into a floating gate of another memory cell that is not selected or may be ejected from the floating gate of another memory cell. For example, in the case where a level of a voltage applied to the first source line SL1 increases, even if the second memory cell 112 that shares the first source line SL1 with the first memory cell 11 or a memory cell adjacent to the first memory cell 111 in a row direction is unselected, the second memory cell 112 or the adjacent memory cell may be programmed in the program operation.

In the case where a level of a voltage applied to the first bit line BL1 decreases, a potential difference between a voltage provided to the first source line SL1 and a voltage applied to the first bit line BL1 may increase. That is, since the amount of hot carriers generated increases, the program characteristic may be improved. In the case where a level of a voltage applied to the first word line WL1 decreases, a level of a voltage applied to the first bit line BL1 may decrease. Also, the influence on another memory cell connected to the first word line WL1 or the first bit line BL1 may be minimized.

The second memory cell 112 includes a second word line transistor Trw2 and a second cell transistor Trc2. The second word line transistor Trw2 includes a first terminal (or a first end) connected to the first bit line BL1, a second terminal (or a second end) connected to the first source line SL1 through the second cell transistor Trc2, and a control terminal connected to a second word line WL2. The second cell transistor Trc2 includes a first terminal (or a first end) connected to the first bit line BL1 through the second word line transistor Trw2, a second terminal (or a second end) connected to the first source line SL1, and a control terminal connected to a second coupling gate line CG2.

The second memory cell 112 is connected with the second word line WL2, a second coupling gate line CG2, the first erase gate line EG1, the first source line SL1, and the first bit line BL1. The second memory cell 112 may share the first erase gate line EG1 and the first source line SL1 with the first memory cell 111. The second memory cell 112 may be disposed adjacent to the first memory cell 111 in a column direction. The first memory cell 111 and the second memory cell 112 may have the same structure, and thus, a detailed description will not be repeated here.

Figure 3:
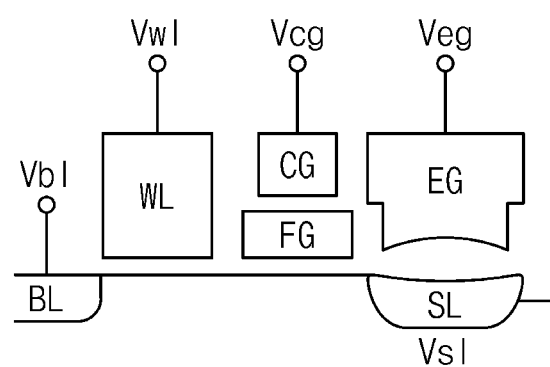
FIG. 3 is a sectional view of a memory cell of FIG. 2.

FIG. 3 is a sectional view of a first memory cell of FIG. 2.

Referring to FIG. 3, the first memory cell 111 includes a bit line connection area BL, a word line connection area WL, a source line connection area SL, a coupling gate CG, a floating gate FG, and an erase gate EG. For convenience of description, FIG. 3 will be described with reference to reference numerals or characters of FIG. 2.

The bit line connection area BL and the source line connection area SL may be formed in a semiconductor substrate. For example, the semiconductor substrate may be a P-type semiconductor substrate. The bit line connection area BL and the source line connection area SL may be an N-doped area of the semiconductor substrate. The bit line connection area BL is connected with the first bit line BL1. A bit line voltage Vbl is applied to the bit line connection area BL. The source line connection area SL is connected with the first source line SL1. A source line voltage Vsl is applied to the source line connection area SL. A channel area is formed between the bit line connection area BL and the source line connection area SL. Electrons may flow in the channel area. In a program operation, electrons may transfer from the bit line connection area BL to the source line connection area SL.

The word line connection area WL is formed over the channel area. An insulating layer may be formed between the word line connection area WL and the semiconductor substrate. The word line connection area WL is connected with the first word line WL1. A word line voltage Vwl is applied to the word line connection area WL. The word line connection area WL may control an electron transfer or a current flow between the source line connection area SL and the bit line connection area BL.

The bit line connection area BL, the source line connection area SL, and the word line connection area WL may form the first word line transistor Trw1. When a level of the word line voltage Vwl exceeds a level of the threshold voltage of the first word line transistor Trw1, electrons may transfer in the channel area. In the program operation, a level difference between the word line voltage Vwl and the threshold voltage may correspond to the bit line voltage Vbl.

The floating gate FG is formed not to overlap the word line connection area WL on the channel area when viewed from the top. An insulating layer may be formed between the word line connection area WL and the semiconductor substrate. In the program operation, electrons transferring from the bit line connection area BL to the source line connection area SL are injected into the floating gate FG.

The coupling gate CG is formed over the floating gate FG. An insulating layer may be formed between the coupling gate CG and the floating gate FG. The coupling gate CG is connected with the first coupling gate line CG1. A coupling gate voltage Vcg is applied to the coupling gate CG. In the program operation, the first voltage generated in the high voltage generator 165 may be applied to the coupling gate CG. An electric field may be formed between the coupling gate CG and the semiconductor substrate by the first voltage, and thus, electrons transferring in the channel area may be injected into the floating gate FG. The bit line connection area BL, the source line connection area SL, the floating gate FG, and the coupling gate CG may form the first cell transistor Trc1.

The erase gate EG is formed over the source line connection area SL. An insulating layer may be formed between the erase gate EG and the source line connection area SL. The erase gate EG is disposed adjacent to the floating gate FG. The erase gate EG is connected with the first erase gate line EG1. An erase gate voltage Veg is applied to the erase gate EG. In an erase operation, the first voltage generated in the high voltage generator 165 may be applied to the erase gate EG. An electric field may be formed between the erase gate EG and the floating gate FG by the first voltage, and thus, electrons injected into the floating gate FG may be tunneled into the erase gate EG.

A threshold voltage of the first word line transistor Trw1 formed by the bit line connection area BL, the source line connection area SL, and the word line connection area WL decreases as an ambient temperature increases. At a low temperature, a current flowing between the source line connection area SL and the bit line connection area BL decreases as a level of the threshold voltage of the first word line transistor Trw1 increases. Accordingly, a program characteristic of the first memory cell 111 becomes deteriorated at the low temperature. At a high temperature, a level of a voltage applied to the bit line connection area BL increases as a level of the threshold voltage decreases. In this case, a level of a bit line voltage provided to another memory cell that shares a bit line with the first memory cell 111 may increase, thereby causing a leakage current.

A voltage applied to a memory cell according to an exemplary embodiment is determined to solve the above problems that may occur based on an ambient temperature. The following table 1 shows the bit line voltage Vbl, the source line voltage Vsl, the word line voltage Vwl, the coupling gate voltage Vcg, and the erase gate voltage Veg according to an exemplary embodiment.

TABLE 1

| Cell state | Temperature (° C.) | Vbl (V) | Vsl (V) | Vwl (V) | Vcg (V) | Veg (V) |
|---|---|---|---|---|---|---|
| Selected memory cell | −40 | a1 | b1 | c1 | d1 | b1 |
| | 25 | a1 | b1 | c2 | d1 | b1 |
| | 125 | a1 | b1 | c3 | d1 | b1 |
| Unselected bit line and selected source line | −40 | a2 | b1 | c1 | d1 | b1 |
| | 25 | a2 | b1 | c2 | d1 | b1 |
| | 125 | a2 | b1 | c3 | d1 | b1 |
| Selected bit line and unselected source line | −40 | a1 | a1 | 0 | 0 | 0 |
| | 25 | a1 | a1 | 0 | 0 | 0 |
| | 125 | a1 | a1 | 0 | 0 | 0 |

Referring to table 1, in the program operation, the first memory cell 111 is classified as a selected memory cell, a memory cell connected with an unselected bit line and a selected source line, or a memory cell connected with a selected bit line and an unselected source line. The selected memory cell means a memory cell that is connected with the selected bit line and the selected source line and corresponds to a target of the program operation.

In the case where the first memory cell 111 is the selected memory cell, a level of the word line voltage Vwl may decrease as a temperature increases. In the case where an ambient temperature is −40° C., a level of the word line voltage Vwl indicates "c1". In the case where an ambient temperature is 25° C., a level of the word line voltage Vwl indicates "c2" lower than "c1". In the case where an ambient temperature is 125° C., a level of the word line voltage Vwl indicates "c3" lower than "c2". Even if a temperature varies, the bit line voltage Vbl having a uniform level of "a1" may be applied to the first memory cell 111.

The bit line voltage Vbl may be the same as a potential difference between the word line voltage Vwl and a threshold voltage of a word line transistor. A level of the threshold voltage may decrease as an ambient temperature increases. A level of the threshold voltage may be (c1−a1) when an ambient temperature is −40° C. A level of the threshold voltage may be (c2−a1) when an ambient temperature is 25° C. A level of the threshold voltage may be (c3−a1) when an ambient temperature is 125° C. That is, the word line voltage Vwl that varies with a temperature may be applied to the first memory cell 111 such that the bit line voltage Vbl is uniformly maintained.

In a memory cell selected at a low temperature, a level of the word line voltage Vwl has a higher level. In this case, a decrease of a channel area due to an increase in the threshold voltage level may be prevented. That is, a program characteristic may be improved at a low temperature. In a memory cell selected at a high temperature, a level of the word line voltage Vwl has a lower level. In this case, a level of the bit line voltage Vbl, which would otherwise increase due to a decrease of the threshold voltage level, may be uniformly maintained. That is, a program current may be prevented from being reduced due to a decrease of a potential difference between the source line voltage Vsl and the bit line voltage Vbl. That is, a program characteristic may be improved at a high temperature.

In addition, hot carriers may be injected into a floating gate of a selected memory cell in a program operation. To form a potential difference for generating hot carriers, the source line voltage Vsl may be set to "b1" that is a voltage higher in level than the bit line voltage Vbl. The coupling gate voltage Vcg may be set to "d1" that is a voltage higher in level than the word line voltage Vwl and the source line voltage Vsl such that hot carriers are injected into a floating gate. Also, the erase gate voltage Veg may be set to "b1" that is a voltage, the level of which is the same as a level of the source line voltage Vsl.

In the case where the first memory cell 111 is a memory cell connected with an unselected bit line and a selected source line, a level of the word line voltage Vwl may decrease as a temperature increases. Similar to the selected memory cell, as an ambient temperature increases to −40° C., 25° C., and 125° C., a level of the word line voltage Vwl decreases to "c1", "c2", and "c3". The bit line voltage Vbl of an unselected bit line may be set to "a2" that is a suppression voltage to prevent a program operation. As the suppression voltage, "a2" is higher in level than "a1". Since the threshold voltage of the first word line transistor Trw1 decreases at a high temperature, a level of the word line voltage Vwl decreases as much as the decrement of the threshold voltage level. In this case, an increase of a channel area due to a decrease in the threshold voltage level may be prevented. That is, a leakage current may be suppressed by decreasing the threshold voltage level.

A memory cell sharing a source line with a selected memory cell may share a word line, a coupling gate line, and an erase gate line with the selected memory cell. Accordingly, a memory cell connected with an unselected bit line and a selected source line may be supplied with the source line voltage Vsl, the word line voltage Vwl, the coupling gate voltage Vcg, and the erase gate voltage Veg that are the same as the selected memory cell.

In the case where the first memory cell 111 is connected with a selected bit line and an unselected source line, voltage levels may not vary with a temperature. A level of the word line voltage Vwl may be set to "0". The bit line voltage Vbl may be set to "a1" because of sharing a bit line with the selected memory cell. To minimize a leakage current, a potential difference between the bit line voltage Vbl and the source line voltage Vsl may be minimized. That is, the source line voltage Vsl may be adjusted to "a1" that is a voltage, the level of which is the same as a level of the bit line voltage Vbl, such that hot carriers are minimally generated.

A memory cell connected with a selected bit line and an unselected source line does not share a word line, a coupling gate line, and an erase gate line. The word line voltage Vwl, the coupling gate voltage Vcg, and the erase gate voltage Veg supplied to a memory cell connected with a selected bit line and an unselected source line may be "0".

Figure 4:
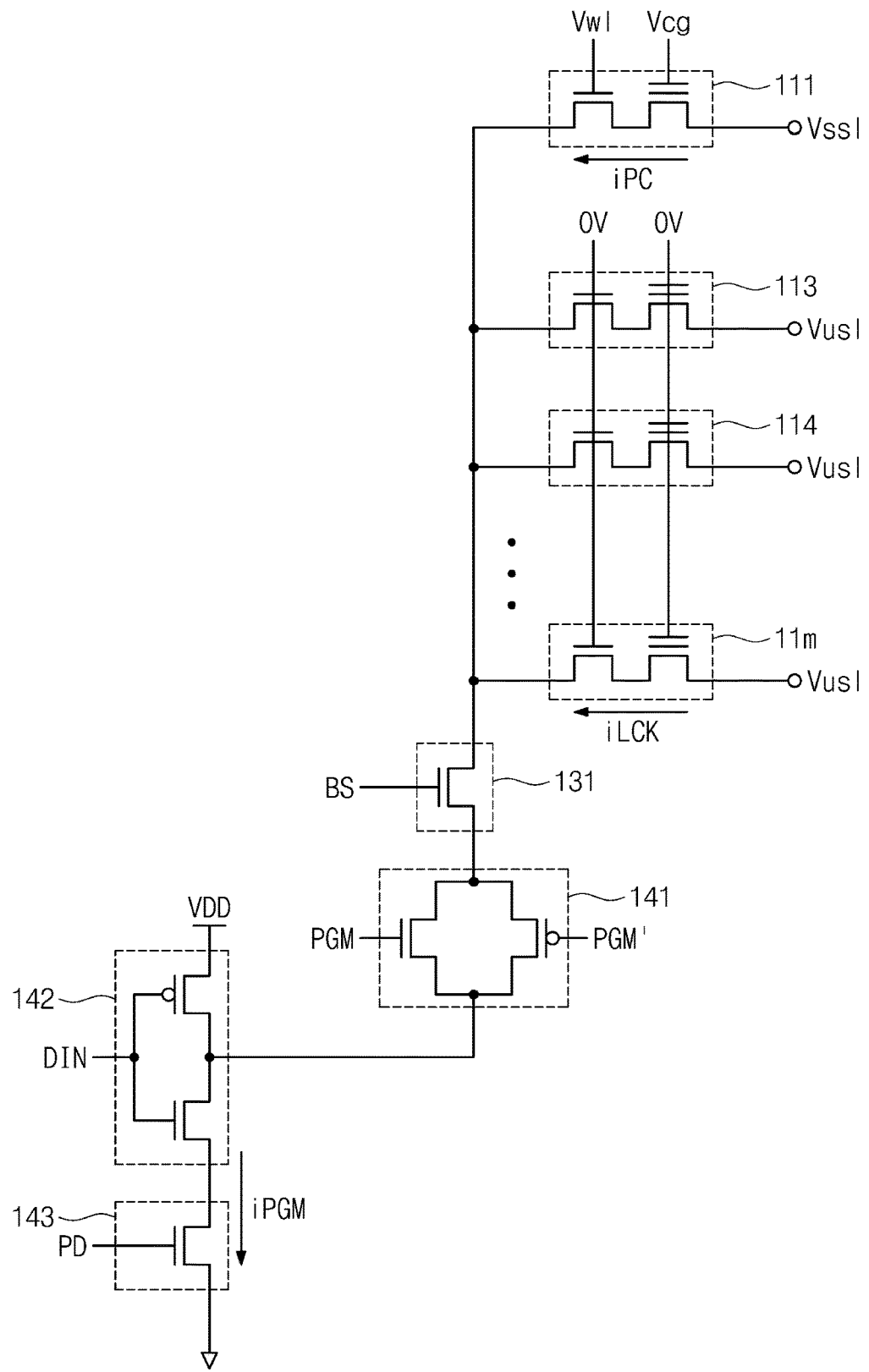
FIG. 4 is a circuit diagram for describing how a selected memory cell is programmed at a selected bit line.

FIG. 4 is a circuit diagram for describing how a selected memory cell is programmed at a selected bit line.

In an exemplary embodiment, memory cells sharing a bit line with a selected memory cell are illustrated in FIG. 4 in addition to the selected memory cell. Here, it is assumed that a selected bit line is the first bit line BL1 of FIG. 2. For convenience of description, FIG. 4 will be described with reference to reference numerals or characters of FIG. 1. Referring to FIG. 4, a configuration of the flash memory device 100, which performs a program operation through the first bit line BL1, includes the first memory cell 111, a first bit line selection transistor 131, a transmission gate 141, a data buffer circuit 142, and a pull-down transistor 143.

The first memory cell 111 is a memory cell selected for the program operation. A source line connected to the first memory cell 111 provides a selected source line voltage Vssl to the first memory cell 111. The selected source line voltage Vssl is the second voltage generated from the middle voltage generator 166. The first memory cell 111 may be supplied with the coupling gate voltage Vcg being a high voltage for the program operation. The first memory cell 111 may be supplied with the word line voltage Vwl. In this case, a voltage level of the first bit line BL1 may be the same as a potential difference between the word line voltage Vwl and a threshold voltage of the first word line transistor Trw1. A program cell current iPC may flow through the first memory cell 111 based on the selected source line voltage Vssl, the word line voltage Vwl, and a voltage of the first bit line BL1.

The memory device 100 may include third to m-th memory cells 113, 114 ... 11m connected to the first bit line BL1. It is assumed that the third to m-th memory cells 113 to 11m are not selected by the row decoder 120 in the program operation. The third to m-th memory cells 113 to 11m may share the first bit line BL1 with the first memory cell 111 and may be respectively connected to source lines that are different from a source line connected to the first memory cell 111. The third to m-th memory cells 113 to 11m may be respectively connected to a coupling gate line connected to the first memory cell 111 and different gate lines. The third to m-th memory cells 113 to 11m may be respectively connected to word lines that are different from a word line connected to the first memory cell 111. A word line voltage and a coupling gate voltage of each of the third to m-th memory cells 113 to 11m may be "0".

A bit line voltage level of each of the third to m-th memory cells 113 to 11m may be the same as a difference between the word line voltage Vwl applied to the first memory cell 111 and a threshold voltage of the first word line transistor Trw1. The third to m-th memory cells 113 to 11m may be supplied with an unselected source line voltage Vus1 from corresponding source lines. Even if a word line voltage is "0", a leakage current iLCK may be generated according to a potential difference between a bit line voltage and the unselected source line voltage Vus1.

A program current iPGM may be the same as a sum of the program cell current iPC flowing to the first memory cell 111 and a leakage current iLCK generated by the third to m-th memory cells 113 to 11m. In the case where a bit line voltage is smaller in level than the unselected source line voltage Vus1, the leak current may flow from the unselected source line to the first bit line BL1. In this case, since the program cell current iPC decreases, a program characteristic of the first memory cell 111 may become deteriorated. In the case where a bit line voltage is greater in level than the unselected source line voltage Vus1, the leak current may flow from the first bit line BL1 to the unselected source line. In this case, since the program cell current iPC increases, power consumption may increase.

As an ambient temperature varies, a threshold voltage of a word line transistor may vary, thereby causing a change in a voltage level of a bit line connected with a selected memory cell. That is, in the case where the unselected source line voltage Vus1 has a fixed voltage level, if a bit line voltage varies with a temperature, the probability that the leakage current iLCK is generated is high. Accordingly, a voltage level of the unselected source line voltage Vus1 according to an exemplary embodiment may be the same as a bit line voltage level. In this case, the leakage current iLCK may be minimized, and thus, the program characteristic may be improved.

The first bit line selection transistor 131 may be included in the bit line selection circuit 130. The bit line selection circuit 130 may include a plurality of bit line selection transistors connected with a plurality of bit lines. The first bit line selection transistor 131 includes a first terminal connected with the first bit line BL1, a second terminal connected with the transmission gate 141, and a control terminal receiving a bit line selection signal BS. The first bit line selection transistor 131 may select the first bit line BL1 in response to the bit line selection signal BS such that the program current iPGM flows therethrough.

The transmission gate 141 may be included in the data input/output circuit 140. The transmission gate 141 may include different types of transistors connected in parallel. For example, the transmission gate 141 may include an NMOS transistor and a PMOS transistor connected in parallel. The NMOS transistor includes a first terminal connected with the second terminal of the first bit line selection transistor 131, a second terminal connected with the data buffer circuit 142, and a control terminal receiving a program signal PGM. The PMOS transistor includes a first terminal connected with the second terminal of the first bit line selection transistor 131, a second terminal connected with the data buffer circuit 142, and a control terminal receiving an inverted program signal PGM'. When the NMOS transistor receives the program signal PGM or the PMOS transistor receives the inverted program signal PGM', the transmission gate 141 may output the program current iPGM such that the program operation is performed.

The data buffer circuit 142 may be included in the data input/output circuit 140. The data buffer circuit 142 may output the program current iPGM such that a program operation corresponding to a received data input signal DIN is performed. The data buffer circuit 142 may include a CMOS inverter. The CMOS inverter may include a PMOS transistor and an NMOS transistor receiving the data input signal DIN. The PMOS transistor may include a first terminal receiving a supply voltage VDD, a second terminal connected with the transmission gate 141, and a control terminal receiving the data input signal DIN. The NMOS transistor may include a first terminal connected with the transmission gate 141, a second terminal connected with the pull-down transistor 143, and a control terminal receiving the data input signal DIN. The data buffer circuit 142 may delay a program operation during a given time from a point in time to receive the data input signal DIN.

The pull-down transistor 143 may be included in the data input/output circuit 140. The pull-down transistor 143 includes a first terminal connected with the data buffer circuit 142, a second terminal grounded, and a control terminal receiving a pull-down signal PD. When the pull-down signal PD is received, the program current iPGM may flow through the pull-down transistor 143. An active pull-down function may be performed in the data input/output circuit 140 by using the pull-down transistor 143.

Figure 5:
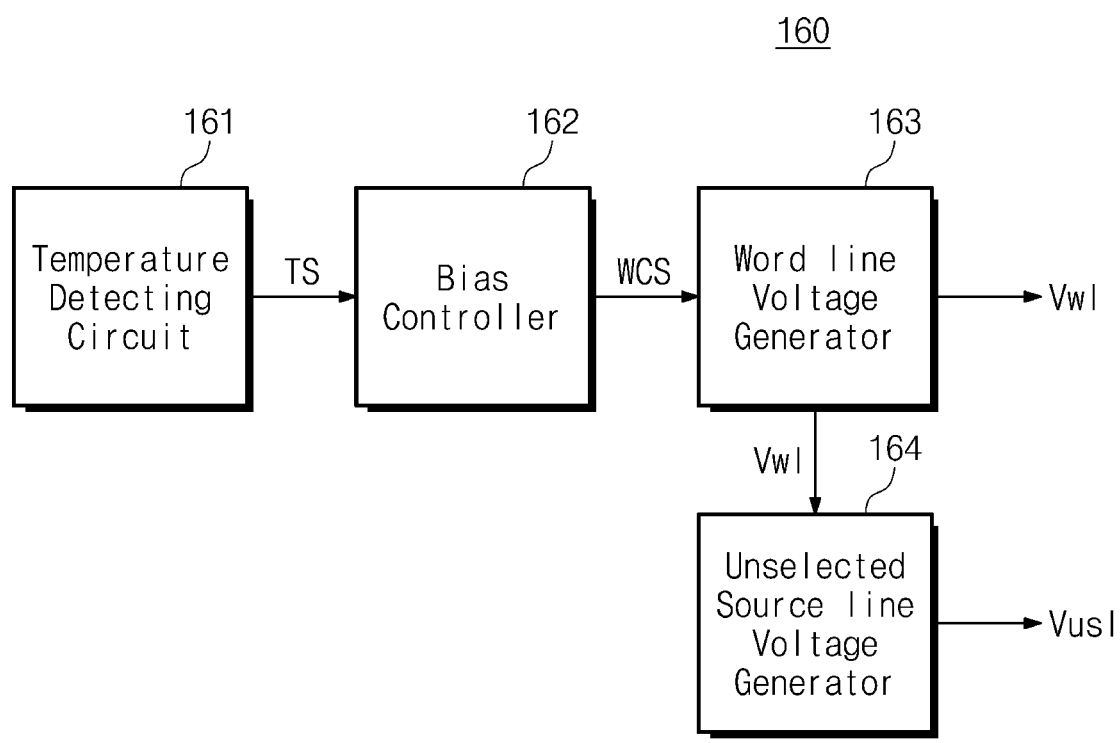
FIG. 5 is a block diagram illustrating an exemplary configuration of a bias generator of FIG. 1.

FIG. 5 is a block diagram illustrating an exemplary configuration of a bias generator of FIG. 1.

Referring to FIG. 5, the bias generator 160 includes a temperature detecting circuit 161, a bias controller 162, a word line voltage generator 163, and an unselected source line voltage generator 164. Although not illustrated in FIG. 5, the bias generator 160 may further include the high voltage generator 165 and the middle voltage generator 166 of FIG. 1.

The temperature detecting circuit 161 detects an ambient temperature. The temperature detecting circuit 161 may include a temperature detecting element having a characteristic variable with a temperature for the purpose of detecting an ambient temperature. The temperature detecting circuit 161 may generate a temperature detection signal TS for changing the word line voltage Vwl or the unselected source line voltage Vus1 depending on a change in an ambient temperature.

The bias controller 162 controls a level of the word line voltage Vwl based on the detected temperature. The bias controller 162 may receive the temperature detection signal TS from the temperature detecting circuit 161. The bias controller 162 may determine an ambient temperature based on the temperature detection signal TS and may allow the word line voltage generator 163 to adjust the word line voltage Vwl to be applied to the selected word line in a program operation. The bias controller 162 may generate a word line voltage control signal WCS for controlling the word line voltage generator 163. The bias controller 162 is illustrated in FIG. 5 as a separate component from the temperature detecting circuit 161, but the disclosure may not be limited thereto. For example, the bias controller 162 may be included in the temperature detecting circuit 161.

The word line voltage control signal WCS may be provided to the word line voltage generator 163 such that a level of the word line voltage Vwl is adjusted. The bias controller 162 may program the word line voltage control signal WCS such that the level of the word line voltage Vwl is adjusted according to the detected temperature. The bias controller 162 may determine a level of a threshold voltage of a word line transistor, which corresponds to the detected temperature. For example, information about a level of a threshold voltage of a word line transistor, which corresponds to the detected temperature, may be in advance set in the bias controller 162, and the bias controller 162 may select threshold voltage level information corresponding to the temperature detection signal TS. The bias controller 162 may generate the word line voltage control signal WCS for adjusting the word line voltage Vwl depending on the selected threshold voltage level information.

The word line voltage generator 163 generates the word line voltage Vwl to be applied to a selected word line in the program operation. The word line voltage generator 163 may receive the word line voltage control signal WCS from the bias controller 162. The word line voltage generator 163 may adjust a level of the word line voltage Vwl in response to the word line voltage control signal WCS. For example, the word line voltage generator 163 may include a variable resistor and may adjust a level of the word line voltage Vwl by adjusting a resistance value of the variable resistor in response to the word line voltage control signal WCS. The word line voltage Vwl thus generated is provided to the row decoder 120 of FIG. 1. The row decoder 120 provides the word line voltage Vwl to a selected word line in the program operation.

The word line voltage generator 163 may generate the word line voltage Vwl of a voltage level that becomes lower as an ambient temperature increases. The word line voltage generator 163 may decrease a level of the word line voltage Vwl as much as a decrement, which corresponds to an increment of a temperature, of a threshold voltage level of a memory cell. Accordingly, a potential difference between the word line voltage Vwl and a threshold voltage may be uniformly maintained. That is, a selected bit line voltage may be uniformly maintained in the program operation.

The unselected source line voltage generator 164 generates the unselected source line voltage Vus1 to be applied to an unselected source line in the program operation. The unselected source line voltage generator 164 may receive the word line voltage Vwl from the word line voltage generator 163. The unselected source line voltage generator 164 may generate the unselected source line voltage Vus1 having the same voltage level as the selected bit line voltage.

The unselected source line voltage generator 164 may include a transistor having the same characteristic as a transistor of a memory cell to be programmed. That is, in the unselected source line voltage generator 164, the same environment as a memory cell may be implemented by using a transistor having the same threshold voltage as a word line transistor of the memory cell. Accordingly, the same voltage as the selected bit line voltage may be generated without detecting the selected bit line voltage. The unselected source line voltage Vus1 thus generated is provided to the row decoder 120 of FIG. 1. The row decoder 120 provides the unselected source line voltage Vus1 to an unselected source line.

Figure 6:
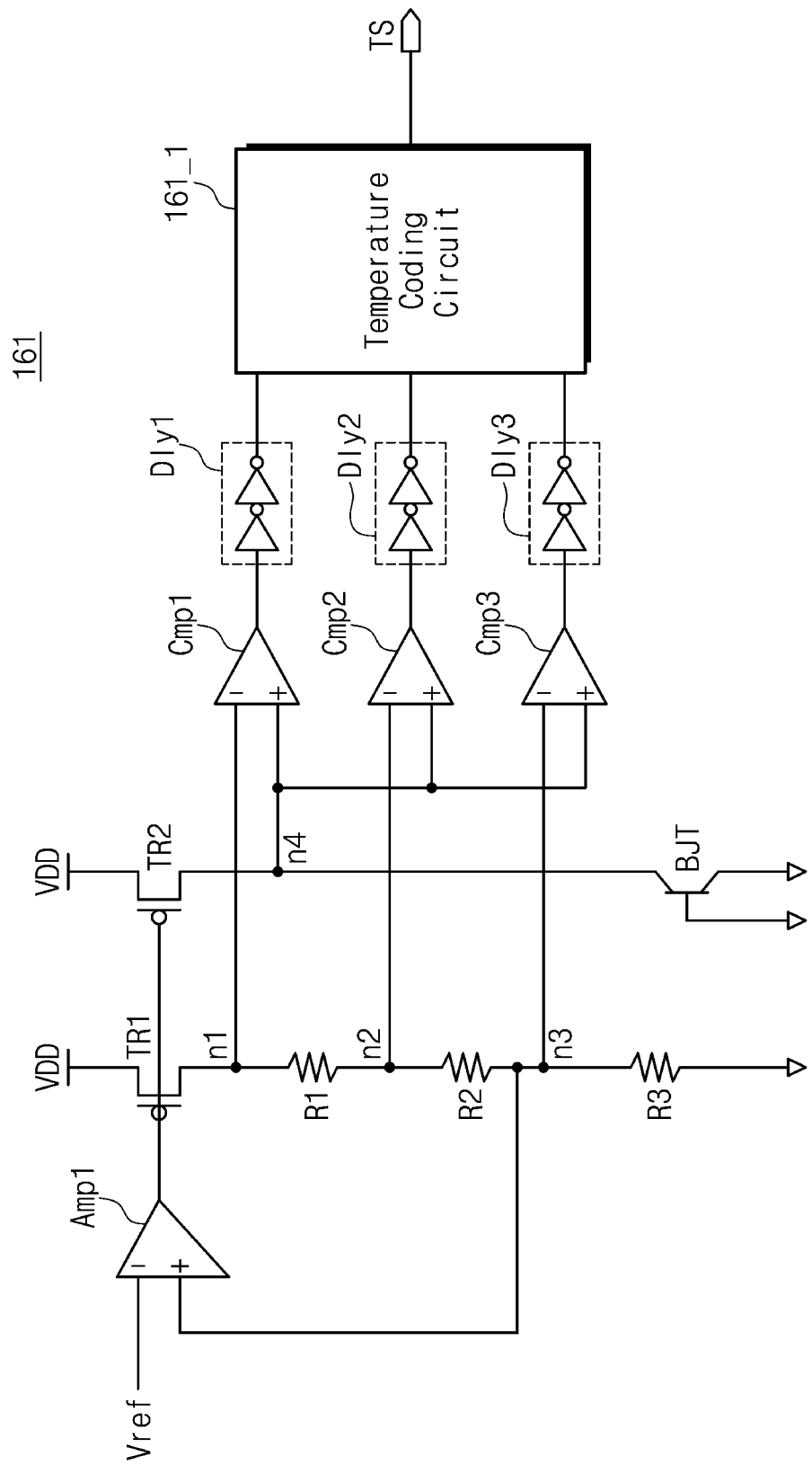
FIG. 6 is a view illustrating an exemplary configuration of a temperature detecting circuit of FIG. 5.

FIG. 6 is a view illustrating an exemplary configuration of a temperature detecting circuit of FIG. 5.

The temperature detecting circuit 161 of FIG. 6 may be understood as one exemplification for detecting an ambient temperature. The temperature detecting circuit 161 may detect an ambient temperature in various manners and may not be limited to the embodiment of FIG. 6.

Referring to FIG. 6, the temperature detecting circuit 161 includes a first amplifier Amp1, first and second transistors TR1 and TR2, a bipolar transistor (or bipolar junction transistor) BJT, first to third comparators Cmp1 to Cmp3, first to third delay circuits Dly1 to Dly3, and a temperature coding circuit 161_1.

The first amplifier Amp 1 may amplify the reference voltage Vref. The first amplifier Amp1 may include a first input terminal receiving the reference voltage Vref, a second input terminal connected with a third node n3, and an output terminal connected with control terminals of the first and second transistors TR1 and TR2. A voltage level of a first node n1 and a voltage level of a second node n2 may be controlled to be greater than a level of the reference voltage Vref by the first amplifier Amp1.

The first transistor TR1 includes a first terminal receiving a supply voltage VDD, a second terminal connected with the first node n1, and a control terminal connected with the output terminal of the first amplifier Amp1. The second transistor TR2 includes a first terminal receiving the supply voltage VDD, a second terminal connected with a fourth node n4, and a control terminal connected with the output terminal of the first amplifier Amp1. The first and second transistors TR1 and TR2 may be PMOS transistors. When the reference voltage Vref is input to the first amplifier Amp1, a reference current may flow through the first transistor TR1, and a variable temperature current may flow through the second transistor TR2.

First to third resistors R1 to R3 may be connected in series to divide the amplified reference voltage. The first resistor R1 includes a first terminal connected to the first node n1 and a second terminal connected to the second node n2. The second resistor R2 includes a first terminal connected to the second node n2 and a second terminal connected to the third node n3. The third resistor R3 includes a first terminal connected to the third node n3 and a second terminal grounded. An example is illustrated in FIG. 6 as three resistors are connected in series, but the number of resistors connected in series may not be limited.

The bipolar transistor BJT may have a great resistance value as a temperature increases. The bipolar transistor BJT is connected to the fourth node n4. The bipolar transistor BJT may be a PNP bipolar transistor. The variable temperature current varies with a change in a resistance value of the bipolar transistor BJT, and thus, a voltage of the fourth node n4 varies. A voltage of the fourth node n4 may decrease as an ambient temperature increases. The bipolar transistor BJT is illustrated in FIG. 6 as a temperature detecting element. However, the disclosure may not be limited thereto. For example, various elements, characteristics of which vary with a temperature, may be used instead of the bipolar transistor BJT.

The first comparator Cmp1 may amplify a potential difference between the first node n1 and the fourth node n4 to compare the voltage of the first node n1 with the voltage of the fourth node n4. The first comparator Cmp1 may include a first input terminal connected to the first node n1, a second input terminal connected with the fourth node n4, and an output terminal connected with the first delay circuit Dly1. The first comparator Cmp1 may be configured to output a comparison voltage based on comparing the voltage of the first node n1 with the voltage of the fourth node n4. For example, the first comparator Cmp1 may be configured to output the comparison voltage having high level when a level of the voltage of the fourth node n4 is higher than a level of the voltage of the first node n1. The first comparator Cmp1 may be configured to output the comparison voltage having low level when the level of the voltage of the fourth node n4 is lower than a level of the voltage of the first node n1.

The second comparator Cmp2 may amplify a potential difference between the second node n2 and the fourth node n4 to compare the voltage of the second node n2 with the voltage of the fourth node n4. The second amplifier Cmp2 may include a first input terminal connected to the second node n2, a second input terminal connected with the fourth node n4, and an output terminal connected with the second delay circuit Dly2. The second comparator Cmp2 may be configured to output a comparison voltage based on comparing the voltage of the second node n2 with the voltage of the fourth node n4. The third comparator Cmp3 may amplify a potential difference between the third node n3 and the fourth node n4 to compare the voltage of the third node n3 with the voltage of the fourth node n4. The third amplifier Cmp3 may include a first input terminal connected to the third node n3, a second input terminal connected with the fourth node n4, and an output terminal connected with the third delay circuit Dly3. The third comparator Cmp3 may be configured to output a comparison voltage based on comparing the voltage of the third node n3 with the voltage of the fourth node n4.

The first delay circuit Dly1 may delay the comparison voltage from the first comparator Cmp1 and may output the delayed voltage to the temperature coding circuit 161_1. The second delay circuit Dly2 may delay the comparison voltage from the second comparator Cmp2 and may output the delayed voltage to the temperature coding circuit 161_1. The third delay circuit Dly3 may delay the comparison voltage from the third comparator Cmp3 and may output the delayed voltage to the temperature coding circuit 161_1.

The temperature coding circuit 161_1 receives voltages output from the first to third delay circuits Dly1 to Dly3. Levels of voltages that are output by the first to third delay circuits Dly1 to Dly3 may vary with a change in an ambient temperature. The temperature coding circuit 161_1 generates the temperature detection signal TS based on the received voltages. The temperature detection signal TS may be provided to the bias controller 162 of FIG. 5. The temperature coding circuit 161_1 may code the temperature detection signal TS to a signal that the bias controller 162 is able to process, based on the detected temperature.

Figure 7:
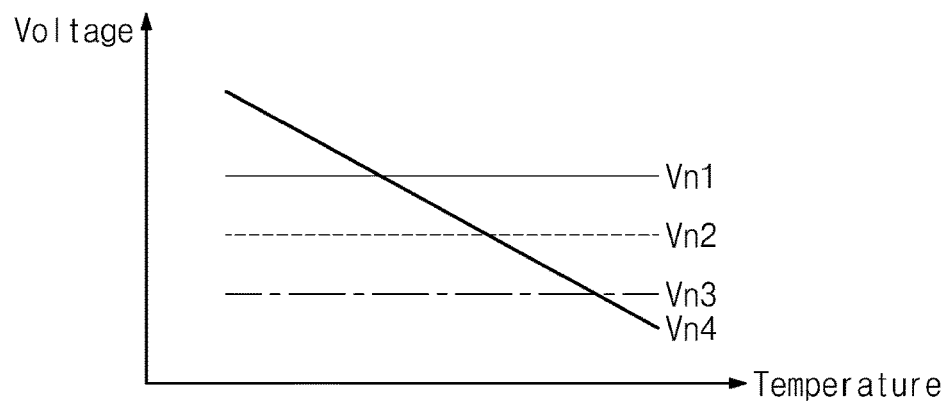
FIG. 7 is a graph for describing a change in a voltage according to a temperature in the temperature detecting circuit of FIG. 6.

FIG. 7 is a graph for describing a change in a voltage according to a temperature in a temperature detecting circuit of FIG. 6.

In FIG. 7, a horizontal axis represents a temperature, and a vertical axis represents a voltage. A graph of FIG. 7 shows voltage levels of first to fourth node voltages Vn1 to Vn4 according to a change in a temperature. The first to fourth node voltages Vn1 to Vn4 indicate voltages of the first to fourth nodes n1 to n4 of FIG. 6, respectively. For convenience of description, FIG. 7 will be described with reference to reference numerals or characters of FIG. 6.

The first to third node voltages Vn1 to Vn3 are voltages divided by the first to third resistors R1 to R3 connected in series. The first node voltage Vn1 has a voltage level higher than the second node voltage Vn2, and the second node voltage Vn2 has a voltage level higher than the third node voltage Vn3. The fourth node voltage Vn4 varies with a characteristic change of the bipolar transistor BJT due to a temperature change. The fourth node voltage Vn4 decreases according to an increase in an ambient temperature.

The temperature detecting circuit 161 may generate the temperature detection signal TS based on voltages output from the first to third comparators Cmp1 to Cmp3. The first comparator Cmp1 may compare the first node voltage Vn1 and the fourth node voltage Vn4. The second comparator Cmp2 may compare the second node voltage Vn2 and the fourth node voltage Vn4. The third comparator Cmp3 may compare the third node voltage Vn3 and the fourth node voltage Vn4. The bias controller 162 may allow the word line voltage generator 163 to change voltage levels of the selected word line voltage Vwl and the unselected source line voltage Vus1 for a program operation, based on the above-described results.

Figure 8:
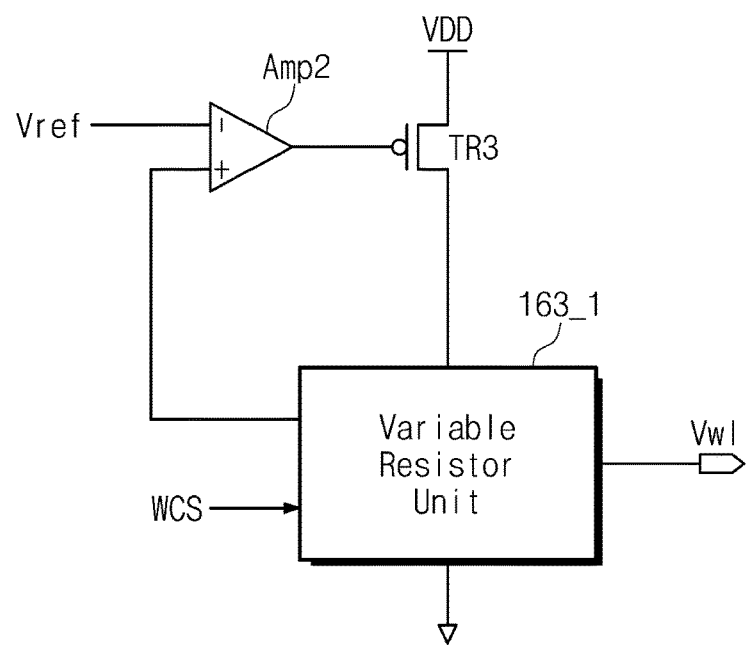
FIG. 8 is a view illustrating an exemplary configuration of a word line voltage generator of FIG. 5.

FIG. 8 is a view illustrating an exemplary configuration of a word line voltage generator of FIG. 5.

The word line voltage generator 163 of FIG. 8 may be understood as one exemplification for generating a selected word line voltage Vwl in a program operation. The word line voltage generator 163 may generate the word line voltage Vwl in various manners. Referring to FIG. 8, the word line voltage generator 163 may include a second amplifier Amp2, a third transistor TR3, and a variable resistor unit 163_1.

The second amplifier Amp2 may amplify the reference voltage Vref. The second amplifier Amp2 may include a first input terminal receiving the reference voltage Vref, a second input terminal connected with the variable resistor unit 163_1, and an output terminal connected with a control terminal of the third transistor TR3. A voltage applied from the third transistor TR3 to the variable resistor unit 163_1 may be amplified by the second amplifier Amp2.

The third transistor TR3 includes a first terminal receiving the supply voltage VDD, a second terminal connected with the variable resistor unit 163_1, and a control terminal connected with the output terminal of the second amplifier Amp2. The third transistor TR3 may be a PMOS transistor. When the reference voltage Vref is input to the second amplifier Amp2, a variable reference current for generating the word line voltage Vwl may flow through the third transistor TR3.

The variable resistor unit 163_1 may include at least one variable resistor, the resistance value of which is changed according to the word line voltage control signal WCS, and an output terminal to output the word line voltage Vwl. For example, the variable resistor may be formed between the second terminal of the third transistor TR3 and the second input terminal of the second amplifier Amp2. Alternatively, the variable resistor may be formed between the second terminal of the third transistor TR3 and the output terminal of the variable resistor unit 163_1. Alternatively, the variable resistor may be formed between the second terminal of the second amplifier Amp2 and a ground. That is, the variable resistor unit 163_1 may be configured to output the word line voltage Vwl that varies with a resistance value of the variable resistor.

The variable resistor unit 163_1 may generate the word line voltage Vwl in response to the word line voltage control signal WCS. A resistance value of the variable resistor included in the variable resistor unit 163_1 may be determined according to the word line voltage control signal WCS. Since the word line voltage control signal WCS indicates an ambient temperature, a change in the resistance value of the variable resistor depends on a change in a temperature. The resistance value of the variable resistor may be determined based on a change in a threshold voltage of a memory cell included in the memory cell array 110 of FIG. 1 when a temperature varies.

Based on a change in the resistance value of the variable resistor, the variable resistor unit 163_1 may divide or amplify the reference voltage Vref to generate the word line voltage Vwl. The word line voltage Vwl thus generated is provided to a selected memory cell in the program operation. A variation in a threshold voltage level of a selected memory cell due to a temperature change may be the same as a variation in the level of the word line voltage Vwl generated by the variable resistor unit 163_1 or may be within a specific range.

Figure 9:
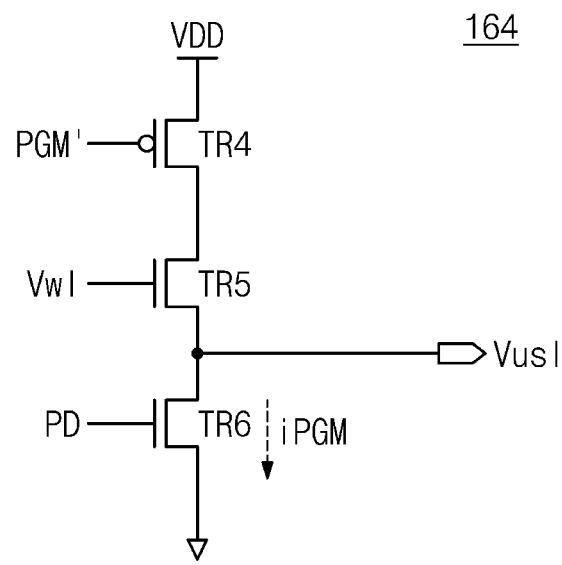
FIG. 9 is a view illustrating an exemplary configuration of an unselected source line voltage generator of FIG. 5.

FIG. 9 is a view illustrating an exemplary configuration of an unselected source line voltage generator of FIG. 5.

The unselected source line voltage generator 164 of FIG. 9 may be understood as one exemplification for generating the unselected source line voltage Vus1. The unselected source line voltage generator 164 may generate the unselected source line voltage Vus1 in various manners. Referring to FIG. 9, the unselected source line voltage generator 164 may include fourth to sixth transistors TR4 to TR6.

The fourth transistor TR4 may include a first terminal receiving the supply voltage VDD, a second terminal connected with a first terminal of the fifth transistor TR5, and a control terminal receiving the inverted program signal PGM'. The fourth transistor TR4 may be a PMOS transistor. In a program operation, the fourth transistor TR4 may be saturated, and thus, the unselected source line voltage generator 164 may be driven. Unlike the configuration of FIG. 9, the fourth transistor TR4 may be omitted.

The fifth transistor TR5 includes the first terminal connected with the second terminal of the fourth transistor TR4, a second terminal outputting the unselected source line voltage Vus1, and a control terminal receiving the word line voltage Vwl. The control terminal of the fifth transistor TR5 may be supplied with the word line voltage Vwl output from the word line voltage generator 163 of FIG. 5. The fifth transistor TR5 may have the same characteristic as a transistor of a memory cell. That is, the fifth transistor TR5 may have the same threshold voltage as a memory cell. A voltage of the second terminal of the fifth transistor TR5 may be the same as a difference between the word line voltage Vwl and a threshold voltage. Accordingly, a potential difference between the word line voltage Vwl and the threshold voltage may be the same as the unselected source line voltage Vus1.

In the program operation, a voltage level of a bit line connected with a selected memory cell may be the same as a difference between the word line voltage Vwl applied to a selected word line and the threshold voltage. Accordingly, the unselected source line voltage Vus1 having a voltage level that is the same as a voltage level of a selected bit line may be output. That is, by the fifth transistor TR5, the unselected source line voltage Vus1 may be controlled to have a voltage level of a selected bit line for a program operation.

The sixth transistor TR6 may include a first terminal connected with the second terminal of the fifth transistor TR5, a second terminal grounded, and a control terminal receiving the pull-down signal PD. When the pull-down signal PD is received, the program current iPGM may flow between the first and second terminals of the sixth transistor TR6. The program current iPGM may be the same as a current flowing to a selected bit line in the program operation. The sixth transistor TR6 may have the same characteristic as the pull-down transistor 143 of FIG. 4.

Figure 10:
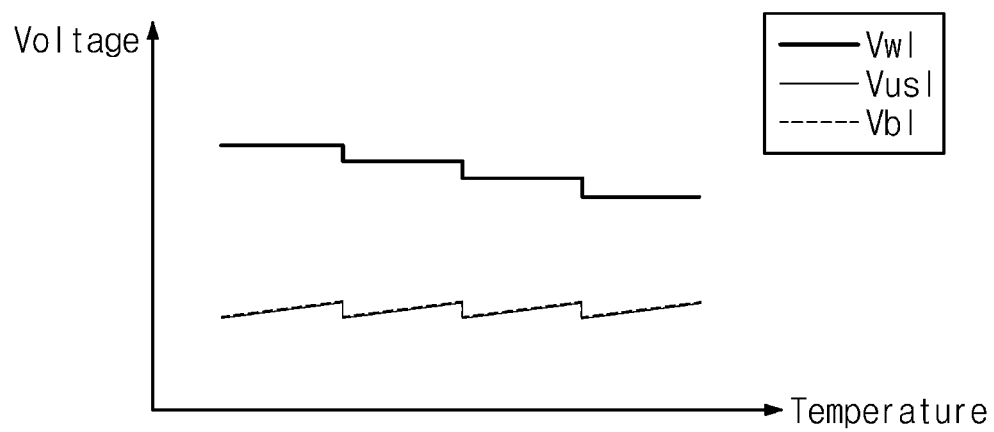
FIG. 10 is a graph for describing a relationship between a word line voltage, an unselected source line voltage, and a selected bit line voltage generated by a bias generator of FIG. 5.

FIG. 10 is a graph for describing a relationship between a word line voltage, an unselected source line voltage, and a selected bit line voltage generated by a bias generator of FIG. 5.

In FIG. 10, a horizontal axis represents a temperature, and a vertical axis represents a voltage. The graph of FIG. 10 shows levels of the word line voltage Vwl, the unselected source line voltage Vus1, and the selected bit line voltage Vbl when a temperature varies. A bold solid line indicates the word line voltage Vwl. A solid line indicates the unselected source line voltage Vus1. A dotted line indicates the bit line voltage Vbl. For convenience of description, FIG. 10 will be described with reference to reference numerals or characters of FIG. 5.

The word line voltage Vwl is generated by the word line voltage generator 163. A threshold voltage level of a memory cell decreases as a temperature increases. The word line voltage generator 163 may decrease a level of the word line voltage Vwl as much as a decrement of the threshold voltage of the memory cell. For example, the word line voltage generator 163 may stepwise decrease a level of the word line voltage Vwl as a temperature increases. When the decrement of the threshold voltage level of the memory cell due to the increase in the temperature exceeds a specific range, the word line voltage generator 163 may decrease a level of the word line voltage Vwl.

The selected bit line voltage Vbl may have a voltage level corresponding to a difference between the word line voltage Vwl and the threshold voltage of the memory cell in a program operation. As described above, the threshold voltage level may decrease as a temperature increases, and a level of the word line voltage Vwl may be stepwise decreased by the word line voltage generator 163 as a temperature increases. Accordingly, a level of the selected bit line voltage Vbl has a tooth waveform. A difference between the minimum value and the maximum value of the selected bit line voltage Vbl may be within a certain range (e.g., reference range).

A level of the unselected source line voltage Vus1 may be the same as a level of the bit line voltage Vbl. The unselected source line voltage generator 164 may receive the word line voltage Vwl and may output a voltage corresponding to a difference between the word line voltage Vwl and the threshold voltage as the unselected source line voltage Vus1. Accordingly, the unselected source line voltage Vus1 may have a tooth waveform that is the same as the selected bit line voltage Vbl.

To sum up, in the program operation, the bias generator 160 generates the word line voltage Vwl that increases as a temperature decreases. That is, it may be possible to prevent a program characteristic from weakening due to a decrease in a channel area according to an increase in a threshold voltage of a word line transistor included in a memory cell at a low temperature. The bias generator 160 generates the word line voltage Vwl that decreases as a temperature increases. That is, at a high temperature, a bit line voltage may increase as the threshold voltage of the word line transistor decreases, and thus, a potential difference between a source line voltage and a bit line voltage may decrease. This may mean that the amount of hot carriers is prevented from decreasing.

The bias generator 160 may minimize a potential difference between a bit line connection area and a source line connection area in a memory cell connected with a selected bit line and an unselected source line. That is, in the program operation, there may be prevented a leakage current generated at a memory cell connected with an unselected source line. Also, in a memory cell connected with an unselected bit line and a selected source line, the bias generator 160 may decrease the word line voltage Vwl when a temperature increases, thereby reducing a leakage current. That is, the probability that a leakage current is generated due to an increase in a channel area when a word line voltage decreases may become lower. Accordingly, it may be possible to prevent electrons from being injected or ejected into or from a floating gate of an unselected memory cell.

Figure 11:
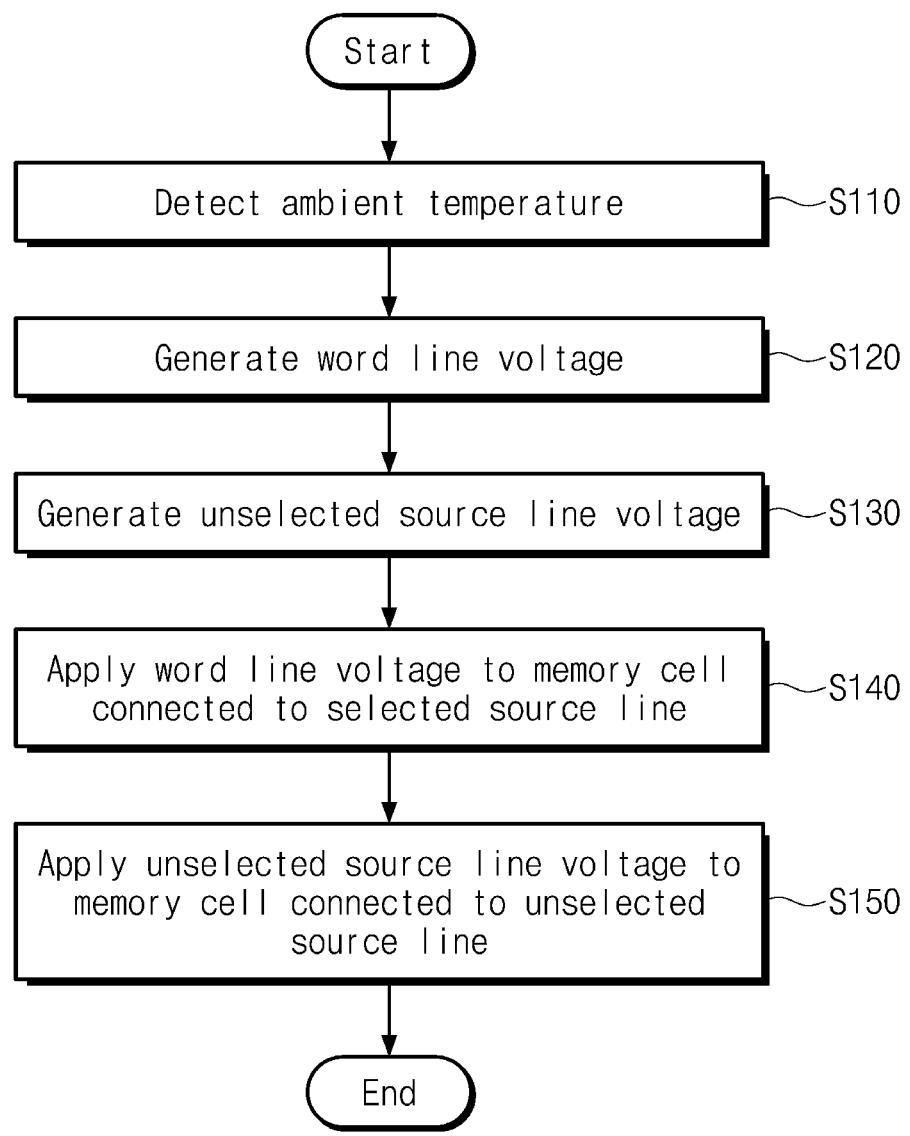
FIG. 11 is a flowchart of a program method of a flash memory device according to an exemplary embodiment.

FIG. 11 is a flowchart of a program method of a flash memory device according to an exemplary embodiment.

Referring to FIG. 11, a program method of a flash memory device is performed in the flash memory device 100 of FIG. 1. For convenience of description, the flowchart of FIG. 11 will be described with reference to reference numerals or characters of FIGS. 1 and 5.

In operation S110, the bias generator 160 senses an ambient temperature of the memory device 100. The ambient temperature may be detected by the temperature detecting circuit 161 included in the bias generator 160. The temperature detecting circuit 161 may detect an ambient temperature and may provide the temperature detection signal TS to the bias controller 162. The bias controller 162 may provide the word line voltage control signal WCS to the word line voltage generator 163 based on the temperature detection signal TS.

In operation S120, the word line voltage generator 163 included in the bias generator 160 generates the word line voltage Vwl based on the word line voltage control signal WCS. The word line voltage generator 163 generates the word line voltage Vwl based on the detected temperature. The word line voltage generator 163 may adjust the word line voltage Vwl so as to have a voltage level that decreases as the ambient temperature increases. The word line voltage generator 163 may adjust the word line voltage Vwl such that a level change in the word line voltage Vwl at a change in a temperature is the same as a level change in a threshold voltage of a word line transistor or is within a specific range. The word line voltage generator 163 may adjust the word line voltage Vwl by using a variable resistor unit having a variable resistance value depending on the detected temperature. The word line voltage Vwl is provided to the row decoder 120.

In operation S130, the unselected source line voltage generator 164 included in the bias generator 160 generates the unselected source line voltage Vus1. The unselected source line voltage generator 164 may generate the unselected source line voltage Vus1 based on the word line voltage Vwl adjusted in operation S120. The unselected source line voltage generator 164 may adjust the unselected source line voltage Vus1 so as to have a voltage level the same as a level of a selected bit line voltage. That is, the unselected source line voltage generator 164 may adjust the unselected source line voltage Vus1 so as to have a voltage level corresponding to a difference between the word line voltage Vwl and a threshold voltage of a word line transistor. The unselected source line voltage Vus1 is provided to the row decoder 120.

In operation S140, the row decoder 120 applies the word line voltage Vwl to a memory cell connected to a selected source line. The memory cell connected to the selected source line includes a memory cell connected with the selected source line and a selected bit line for a program operation. Also, the memory cell connected to the selected source line includes a memory cell connected with the selected source line and an unselected bit line. The row decoder 120 may select a source line for the program operation under control of the control circuit 150. The bit line selection circuit 130 may select a bit line for the program operation under control of the control circuit 150. Under control of the control circuit 150, the row decoder 120 may select a word line for the program operation and may apply the word line voltage Vwl to the selected word line. The row decoder 120 may not apply a voltage to an unselected word line.

In the memory cells to which the word line voltage Vwl is applied, a voltage level of a selected bit line may be the same as a difference between the word line voltage Vwl and the threshold voltage of the word line transistor. In the memory cells to which the word line voltage Vwl is applied, a suppression voltage may be applied to an unselected bit line. The bit line selection circuit 130 may apply the suppression voltage to the unselected bit line to inhibit a program operation of a memory cell connected to the unselected bit line.

In operation S150, the row decoder 120 applies an unselected source line voltage to a memory cell connected to an unselected source line. The row decoder 120 selects a source line for the program operation and applies the unselected source line voltage Vus1 to the unselected source line. Memory cells connected with the selected bit line and the unselected source line may have the same potential difference between a bit line connection area and a source line connection area. The row decoder 120 may apply a selected source line voltage to the selected source line, and the selected source line voltage may be a voltage generated in the middle voltage generator 166.

Although not illustrated in FIG. 11, the program method of the flash memory device may further include applying a voltage generated in the high voltage generator 165 to a memory cell connected to a selected coupling gate line. Also, the program method of the flash memory device may further include applying a voltage generated in the middle voltage generator 166 to a memory cell connected to a selected erase gate line.

Figure 12:
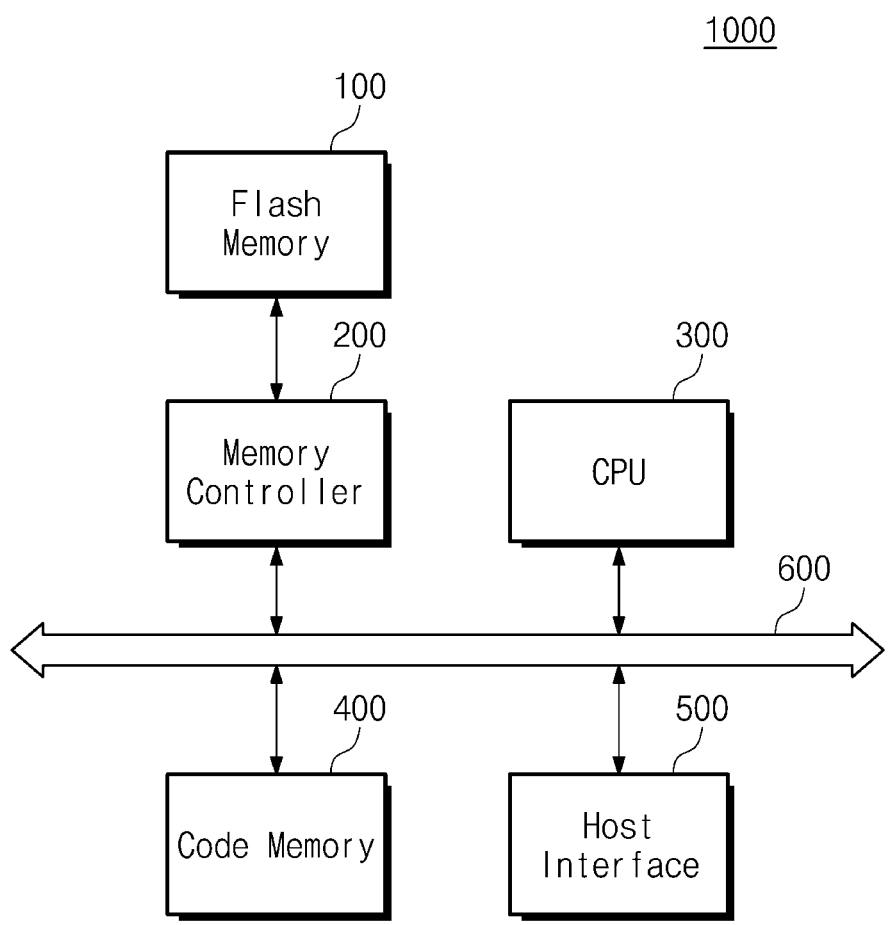
FIG. 12 is an exemplary block diagram of a memory system including the flash memory device of FIG. 1.

FIG. 12 is an exemplary block diagram of a memory system including a flash memory device of FIG. 1.

Referring to FIG. 12, a memory system 1000 may include the flash memory device 100, a memory controller 200, a central processing unit (CPU) 300, a code memory 400, a host interface 500, and a bus 600. The memory system 1000 of FIG. 12 may be an embedded memory system in which a program and a logic circuit for an access to the flash memory device 100 are integrated in a single chip.

The memory controller 200 controls the flash memory device 100. The memory controller 200 may receive a program command and may control the flash memory device 100 such that program data are stored in the flash memory device 100. Also, the memory controller 200 may receive a read command and may control the flash memory device 100 such that a read operation is performed. The memory controller 200 may receive an erase command and may control the flash memory device 100 such that an erase operation is performed.

The central processing unit 300 may control overall operations of the memory system 1000. For example, the central processing unit 300 may generate a command for performing a program operation, a read operation, or an erase operation in response to an external request. Also, the central processing unit 300 may control each component of the memory system 1000 such that various operations are performed.

The code memory 400 may store a variety of code information for accessing the flash memory device 100 or driving the flash memory device 100. The central processing unit 300 may control the flash memory device 100 and the memory controller 200 based on the pieces of code information stored in the code memory 400. The code memory 400 may include a nonvolatile memory device.

The host interface 500 may provide an interface between a host and the memory system 1000. The host interface 500 may communicate with the host based on at least one of various interface protocols such as universal serial bus (USB), small computer small interface (SCSI), peripheral component interconnect (PCI) express, advanced technology attachment (ATA), parallel ATA (PATA), serial ATA (SATA), serial attached SCSI (SAS), and the like.

The bus 600 may provide a communication path between the memory controller 200, the central processing unit 300, the code memory 400, and the host interface 500 of the memory system 1000. The respective components of the memory system 1000 may exchange information with each other through the bus 600.

According to exemplary embodiments, a flash memory device and a program method thereof adjust a word line voltage and an unselected source line voltage based on a temperature change, thereby improving a program characteristic and minimizing a leakage current of an unselected memory cell.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A flash memory device comprising:
a first memory cell comprising a first cell transistor, the first cell transistor being connected to a selected bit line through a first word line transistor and connected to a selected source line;
a second memory cell comprising a second cell transistor, the second cell transistor being connected to the selected bit line through a second word line transistor and connected to an unselected source line;
a row decoder configured to control a word line voltage to be applied to a first word line connected to the first word line transistor, and configured to control a selected source line voltage to be applied to the selected source line and an unselected source line voltage to be applied to the unselected source line; and
a bias generator comprising:
a temperature detecting circuit configured to detect an ambient temperature;
a word line voltage generator configured to adjust a level of the word line voltage based on a change of the detected ambient temperature; and
an unselected source line voltage generator configured to generate the unselected source line voltage based on the adjusted level of the word line voltage.

2. The flash memory device of claim 1, wherein the bias generator is configured to adjust the level of the word line voltage to be decreased in response to an increase in the ambient temperature.

3. The flash memory device of claim 1, wherein the bias generator is configured to adjust the level of the word line voltage based on a variation in a level of a threshold voltage of the first word line transistor in response to the change of the detected ambient temperature.

4. The flash memory device of claim 1, wherein the bias generator is configured to generate the unselected source line voltage, a level of which is the same as a voltage level of the selected bit line.

5. The flash memory device of claim 1, wherein the word line voltage generator comprises:
a variable resistor unit having a resistance value varying with a magnitude of the detected ambient temperature, the variable resistor unit configured to adjust the level of the word line voltage based on the resistance value.

6. The flash memory device of claim 1, wherein the bias generator further comprises:
a bias controller configured to control the word line voltage generator based on a temperature detection signal generated by the temperature detecting circuit.

7. The flash memory device of claim 1, wherein the bias generator is configured to generate the selected source line voltage, a level of which is higher than a voltage level of the selected bit line, and
wherein the row decoder is configured to receive the word line voltage, the selected source line voltage, and the unselected source line voltage from the bias generator, apply the word line voltage and the selected source line voltage to the first memory cell, and apply the unselected source line voltage to the second memory cell.

8. The flash memory device of claim 1, wherein a memory cell array in which the first memory cell and the second memory cell are included is of a NOR flash type.

9. A flash memory device comprising:
a first memory cell connected to a selected bit line and a selected source line;
a second memory cell connected to the selected bit line and an unselected source line;
a row decoder configured to apply a word line voltage to the first memory cell, and apply a selected source line voltage to the selected source line and an unselected source line voltage to the unselected source line; and
a bias generator comprising:
a temperature detecting circuit configured to detect an ambient temperature;
a word line voltage generator configured to adjust a level of the word line voltage based on a change of the detected ambient temperature; and
an unselected source line voltage generator configured to generate the unselected source line voltage based on the adjusted level of the word line voltage.

10. The flash memory device of claim 9, wherein the first memory cell comprises:
a first word line transistor comprising a first terminal connected to the selected bit line, a second terminal connected to the selected source line, and a control terminal connected to a first word line, and
wherein the second memory cell comprises:
a second word line transistor comprising a first terminal connected to the selected bit line, a second terminal connected to the unselected source line, and a control terminal connected to a second word line.

11. The flash memory device of claim 10, wherein the bias generator is configured to adjust the level of the word line voltage, to be applied to the first word line, based on a variation in a level of a threshold voltage of the first word line transistor in response to the change in the ambient temperature.

12. The flash memory device of claim 10, wherein the bias generator is configured to adjust the level of the word line voltage to be applied to the first word line such that a voltage level of the selected bit line is within a reference range, and configured to adjust a level of the unselected source line voltage to be within the reference range based on the adjusted level of the word line voltage.

13. The flash memory device of claim 10, wherein the bias generator is configured to stepwise decrease the level of the word line voltage to be applied to the first word line in response to an increase of the ambient temperature.

14. The flash memory device of claim 10, wherein the unselected source line voltage generator comprises:
a transistor comprising a control terminal configured to receive the word line voltage, the transistor having a threshold voltage that is equal to a threshold voltage of the first word line transistor, and
wherein the transistor is configured to output the unselected source line voltage, a level of which corresponds to a difference between the word line voltage and the threshold voltage of the transistor.

15. The flash memory device of claim 9, wherein the bias generator is configured to generate the unselected source line voltage, a level of which is the same as a voltage level of the selected bit line.

16. A program method of a flash memory device which comprises a memory cell array, the program method comprising:
- detecting, by using a temperature detecting circuit, an ambient temperature;
- adjusting, by using a word line voltage generator, a level of a word line voltage based on the detected ambient temperature;
- generating, by using an unselected source line voltage generator, an unselected source line voltage based on the adjusted level of the word line voltage and a voltage level of a selected bit line;
- applying the word line voltage to a selected memory cell of the memory cell array, the selected memory cell comprising a first cell transistor connected to the selected bit line through a first word line transistor and connected to a selected source line; and
- applying the unselected source line voltage to an unselected memory cell of the memory cell array, the unselected memory cell comprising a second cell transistor connected to the selected bit line through a second word line transistor and connected to an unselected source line.

17. The program method of claim 16, wherein the adjusting comprises:
- adjusting the level of the word line voltage such that a change in the voltage level of the selected bit line based on the change in the ambient temperature is within a specific range.

18. The program method of claim 16, further comprising:
- applying a suppression voltage to an unselected bit line; and
- applying a selected source line voltage to the selected memory cell such that hot carriers are injected into a floating gate of the selected memory cell.

* * * * *